United States Patent
Lin

(10) Patent No.: US 7,579,676 B2
(45) Date of Patent: Aug. 25, 2009

(54) LEADLESS LEADFRAME IMPLEMENTED IN A LEADFRAME-BASED BGA PACKAGE

(75) Inventor: Hung-Tsun Lin, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/580,310

(22) Filed: Oct. 13, 2006

(65) Prior Publication Data

US 2007/0215995 A1 Sep. 20, 2007

(30) Foreign Application Priority Data

Mar. 24, 2006 (TW) .............................. 95110298 A

(51) Int. Cl.
*H01L 23/495* (2006.01)

(52) U.S. Cl. .................. 257/676; 257/666; 257/692; 257/782; 257/783; 257/784; 257/786; 257/E23.043; 257/E23.046

(58) Field of Classification Search ................ 257/666, 257/676, 692, 782–784, 786, E23.043, E23.046
See application file for complete search history.

(56) References Cited

U.S. PATENT DOCUMENTS

| 6,204,553 | B1 * | 3/2001 | Liu et al. ................. 257/676 |
| 6,451,627 | B1 * | 9/2002 | Coffman .................. 438/111 |
| 6,462,422 | B2 * | 10/2002 | Huang ..................... 257/777 |
| 6,703,700 | B2 * | 3/2004 | Hsu et al. ................ 257/680 |
| 6,933,594 | B2 * | 8/2005 | McLellan et al. ......... 257/676 |
| 6,984,878 | B2 * | 1/2006 | Park et al. ............... 257/670 |
| 2003/0071332 | A1 * | 4/2003 | Hsu et al. ................ 257/676 |

FOREIGN PATENT DOCUMENTS

| TW | 529770 | 4/2003 |
| TW | 567566 | 12/2003 |
| TW | 584316 | 4/2004 |

* cited by examiner

*Primary Examiner*—Andy Huynh
(74) *Attorney, Agent, or Firm*—WPAT, P.C.; Anthony King

(57) ABSTRACT

A leadless leadframe has a plurality of bottom leads and a plurality of top soldering pads formed in different layers. After encapsulation and before solder ball placement, a half-etching process is performed to remove the bottom leads to make the top soldering pads electrically isolated, exposed and embedded in the encapsulant for solder ball placement where the soldering area of the top soldering pads is defined without the need of solder mask(s) to solve the diffusion of solder balls on the leads during reflow.

7 Claims, 8 Drawing Sheets

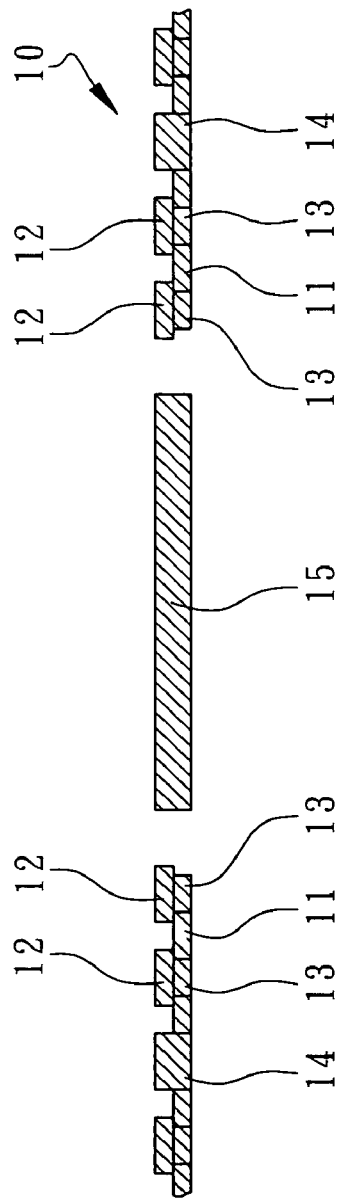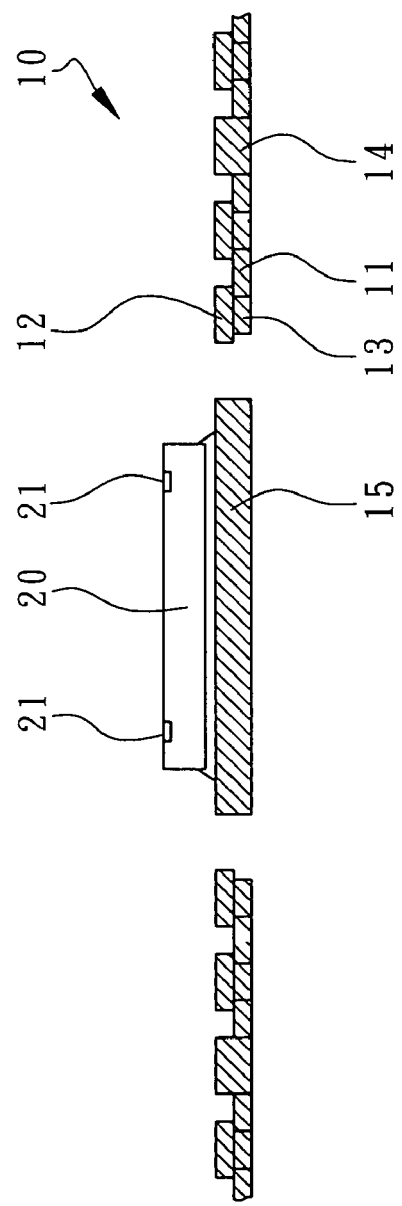

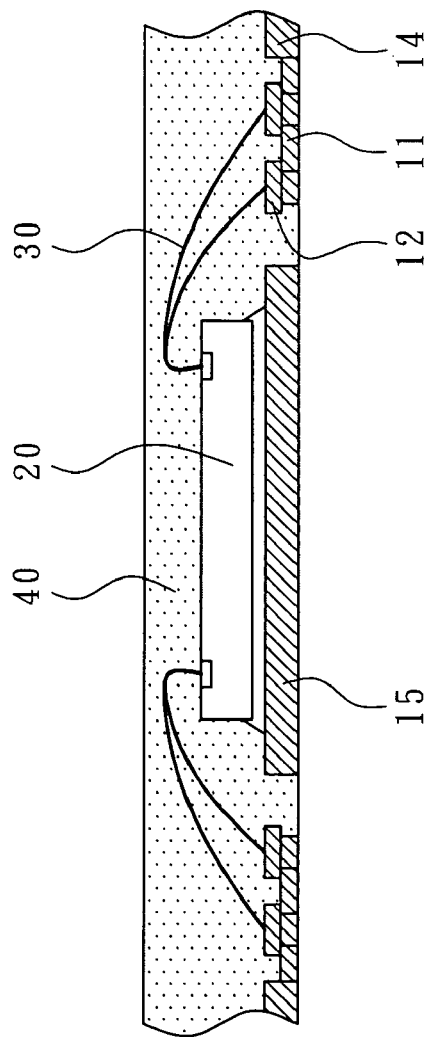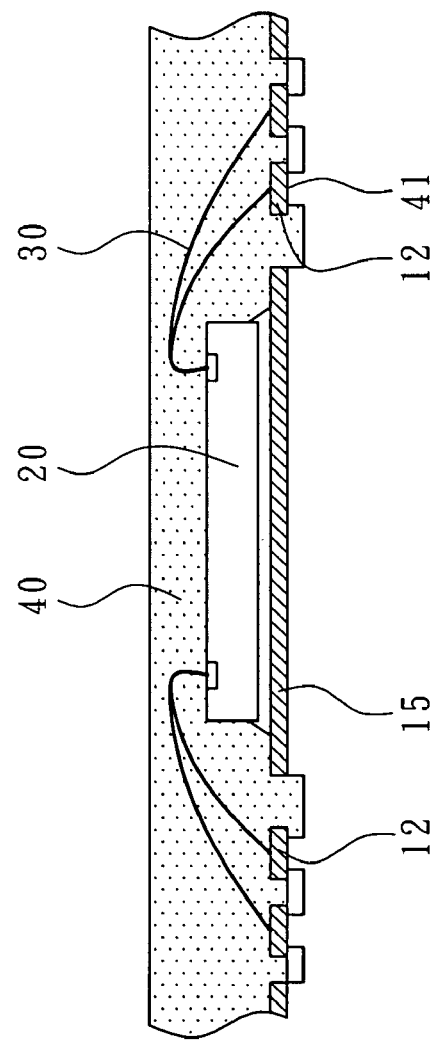

LEADLESS LEADFRAME IMPLEMENTED IN A LEADFRAME-BASED BGA PACKAGE

FIELD OF THE INVENTION

The present invention relates to fabrication technology of BGA (Ball Grid Array) packages, and more particularly, to a fabrication process of leadframe-based BGA packages and a leadless leadframe implemented in the processes.

BACKGROUND OF THE INVENTION

Leadframe-based Ball Grid Array (LFBGA) has the advantages of higher packaging density, lower manufacturing cost, and better thermal dissipation. A leadless leadframe is implemented to replace traditional printed circuit boards or ceramic substrates. Solder balls are disposed on the leads of the leadframe where the solder balls are disposed in an array or in multiple rows to provide electrical connection to an external printed circuit board by SMT. Related technologies have been disclosed by R.O.C. Taiwan Patent No. 529770 and 584316.

An extra reflowing process is required for leadframe-based BGA to solder the solder balls on the leads of the leadframe. However, due to the high reflowing temperatures, the wettibility of the solder balls become better where the solder balls will completely wet the other surface of the leads leading to the insufficient height of the solder balls or even bridging between the leads. A solution is provided by half-etching the leadframes before die-attaching and molding so that only the soldering areas of the leads is protruded then following by encapsulation to encapsulate the other portions of the leads. However, during encapsulation, the only contacting areas of the leads for bonding solder balls are pressed against the molding chest or adhesive tapes, therefore, mold flashes will become an issue. Moreover, since the soldering areas of the leads and the bottom surface of the encapsulant are on the same plane so that mold flash can not easily be detected and removed leading to weakening soldering strength and dropping of solder balls.

Conventional manufacturing processes of leadframe-based BGA packages are disclosed in R.O.C. Taiwan Patent No. 567566. A non-conductive film with through holes to expose the soldering areas of the leads is attached to the bottom surface of the leadframe as solder masks. Since there are gaps between the leads, the non-conductive film must be pre-formed corresponding to the layout of the leads where extra tooling and waste of non-conductive material can not be saved. Furthermore, when attaching the pre-formed non-conductive film to the leadframe, accurate alignment between through holes and the soldering areas is required. Once the through holes of the non-conductive film can not be covered by the leads, encapasulant will flow into the through holes leading to the failure of solder balls placement.

SUMMARY OF THE INVENTION

The main purpose of the present invention is to provide manufacturing processes of leadframe-based BGA packages. A leadless leadframe has a special two-layer structure. After encapsulation and before solder ball placement, a half-etching process is performed to remove bottom leads and bottom sacrificial pads of the leadless leadframe to make a plurality of top soldering pads electrically isolated, exposed and embedded in the encapsulant to further define and control the soldering area of the top soldering pads without any solder mask. Moreover, the flooding of solder balls on the leads during reflow can be avoided and the mold flashes at the bottom surface of the encapsulant can easily be detected then removed. Also the leadless leadframe for the processes is disclosed.

The second purpose of the present invention is to provide manufacturing processes of leadframe-based BGA packages where a leadless leadframe not only has bottom leads and top soldering pads, but also has a plurality of bottom sacrificial pads connecting and aligned with the top soldering pads. During a half-etching step, the bottom sacrificial pads are removed with the bottom leads for being filled with solder balls during reflow to increase the soldering strength of the solder balls. Moreover, the top soldering pads will not be removed.

The third purpose of the present invention is to provide manufacturing processes of leadframe-based BGA packages where a leadless leadframe further has a die pad and a plurality of tie bars formed in a lower layer of the leadless leadframe. During the half-etching process, the tie bars are removed with the bottom leads to prevent the diffusion of solder paste under the die pad.

The fourth purpose of the present invention is to provide a leadless leadframe for manufacturing leadframe-based BGA packages where the leadless leadframe has a plurality of bottom leads and a plurality of top soldering pads formed in different layers of the leadframe. The leadless leadframe further has a plurality of bottom sacrificial pads connected to and aligned with the top soldering pads. During packaging, the top soldering pads are fixed by the bottom leads before the half-etching process. After the half-etching process of the bottom leads, the bottom sacrificial pads offer a half-etching buffer thickness so as not to remove the top soldering pads. The bottom sacrificial pads also can be used as an indicator before solder ball placement to control the soldering area of the top soldering pads and to reduce the packaging cost of leadframe-based BGA packages.

The manufacturing processes of a leadframe-based BGA package according to the present invention are provided. Firstly, a leadless leadframe having a plurality of bottom leads and a plurality of top soldering pads is provided. The leadframe further has a plurality of bottom sacrificial pads formed in the same layer with the bottom leads, where the bottom sacrificial pads are connected to and aligned with the top soldering pads. Then, during the die-attaching process, at least a chip is attached to the leadless leadframe. During or after die-attaching process, the chip is electrically connected to the leadless leadframe. Then, during encapsulation, an encapsulant is formed on the leadless leadframe. After encapsulation, during the half-etching process, the bottom leads and the bottom sacrificial pads are removed to make the top soldering pads electrically isolated, exposed and embedded in the encapsulant. Then, a plurality of solder balls are placed on the top soldering pads. Therefore, the area of the soldering pads can be defined without any solder masks. Moreover, mold flashes can easily be detected and removed to enhance the soldering strength of the solder balls with lower cost.

DESCRIPTION OF THE DRAWINGS

FIG. 2A to 2G shows cross sectional views of a leadframe-based BGA package during the manufacturing processes according to the first embodiment of the present invention.

DETAIL DESCRIPTION OF THE INVENTION

Please refer to the attached drawings, the present invention will be described by means of embodiment(s) below.

Figure 1:
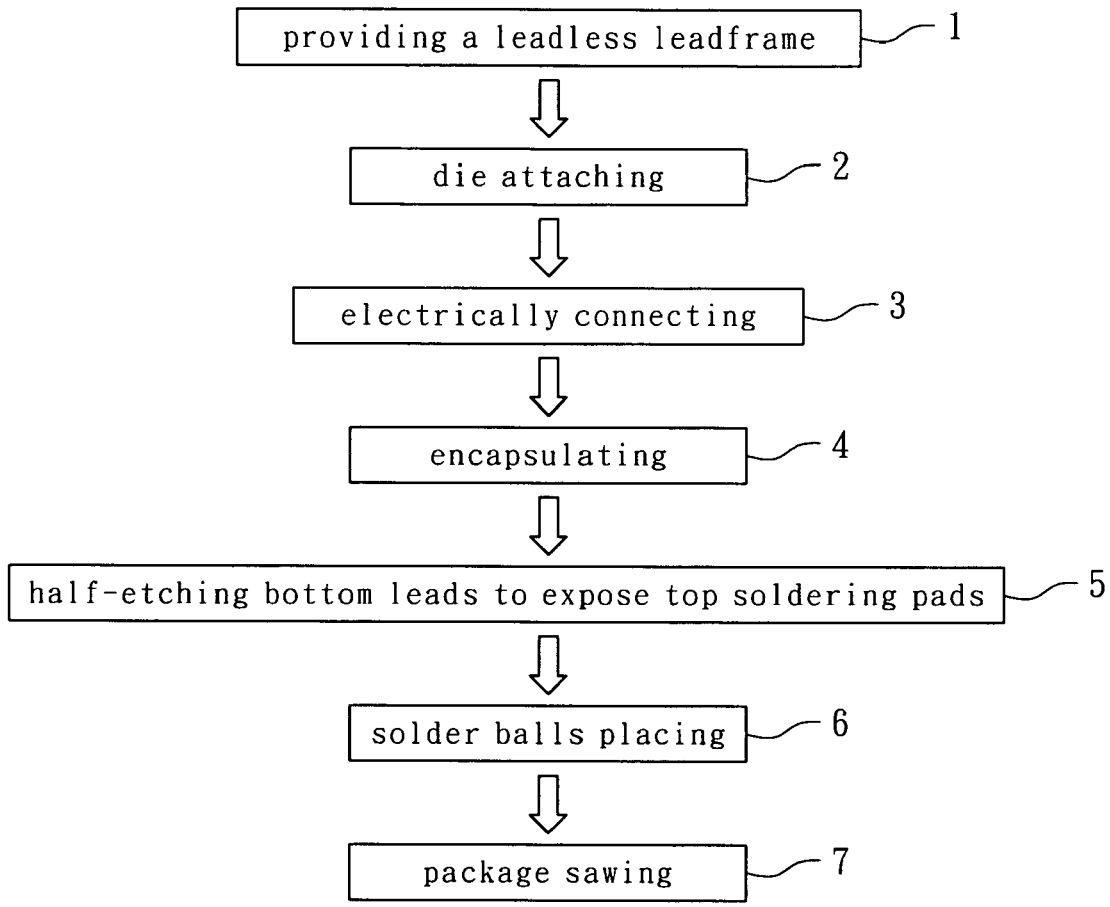
FIG. 1 shows a block diagrams of manufacturing processes of a leadframe-base BGA package according to the present invention.

As shown in FIG. 1, the manufacturing processes of a leadframe-based BGA package according to the present invention, includes the following processes: step 1 of "providing a leadless leadframe"; step 2 of "die attaching"; step 3 of "electrically connecting"; step 4 of "encapsulating"; step 5 of "half-etching the bottom leads to expose the top soldering pads"; step 6 of "solder balls placing", and step 7 of "package sawing". The detail descriptions are illustrated from FIG. 2A to FIG. 2G as follows.

Figure 2C:
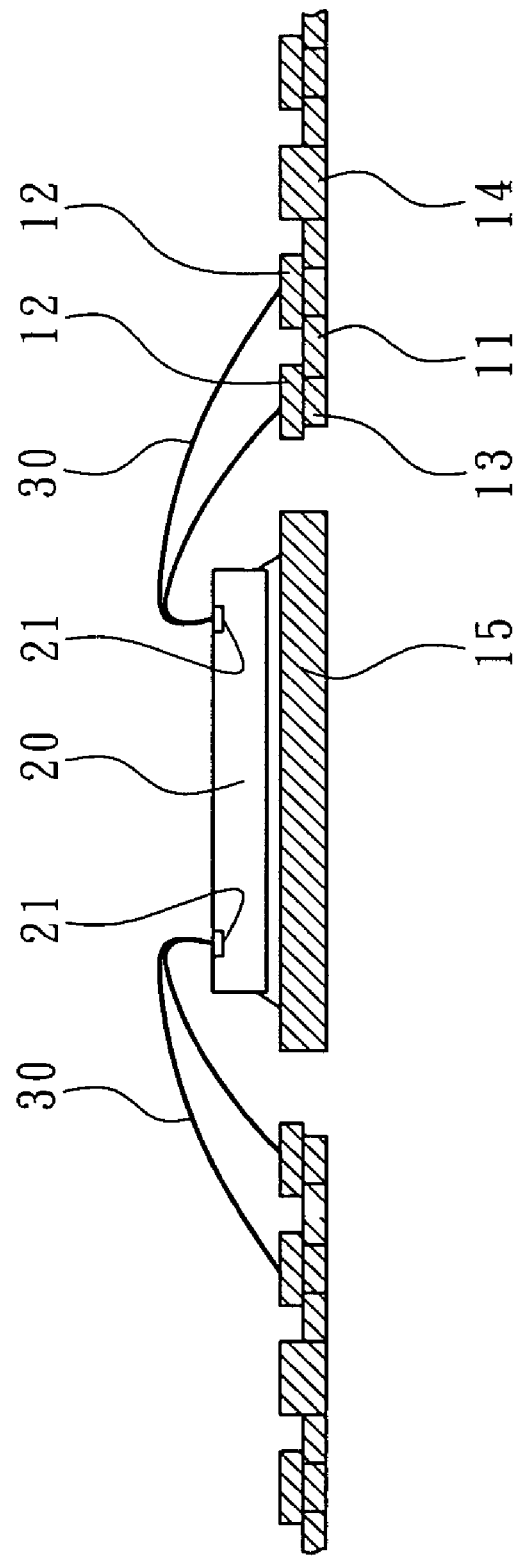
Figure 3:
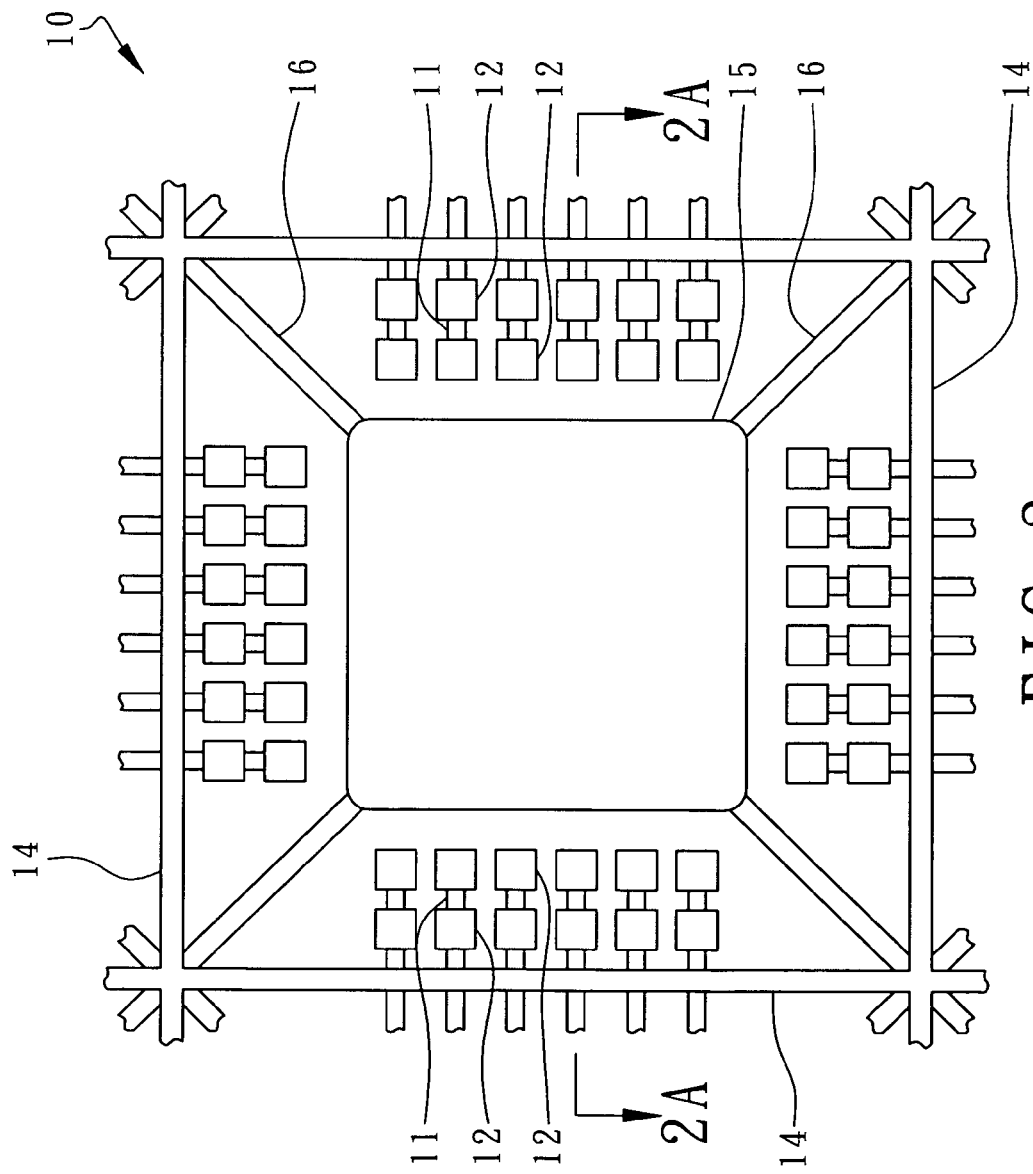
FIG. 3 shows a top view of a leadless leadframe implemented in the leadframe-based BGA package according to the first embodiment of the present invention.
Figure 4:
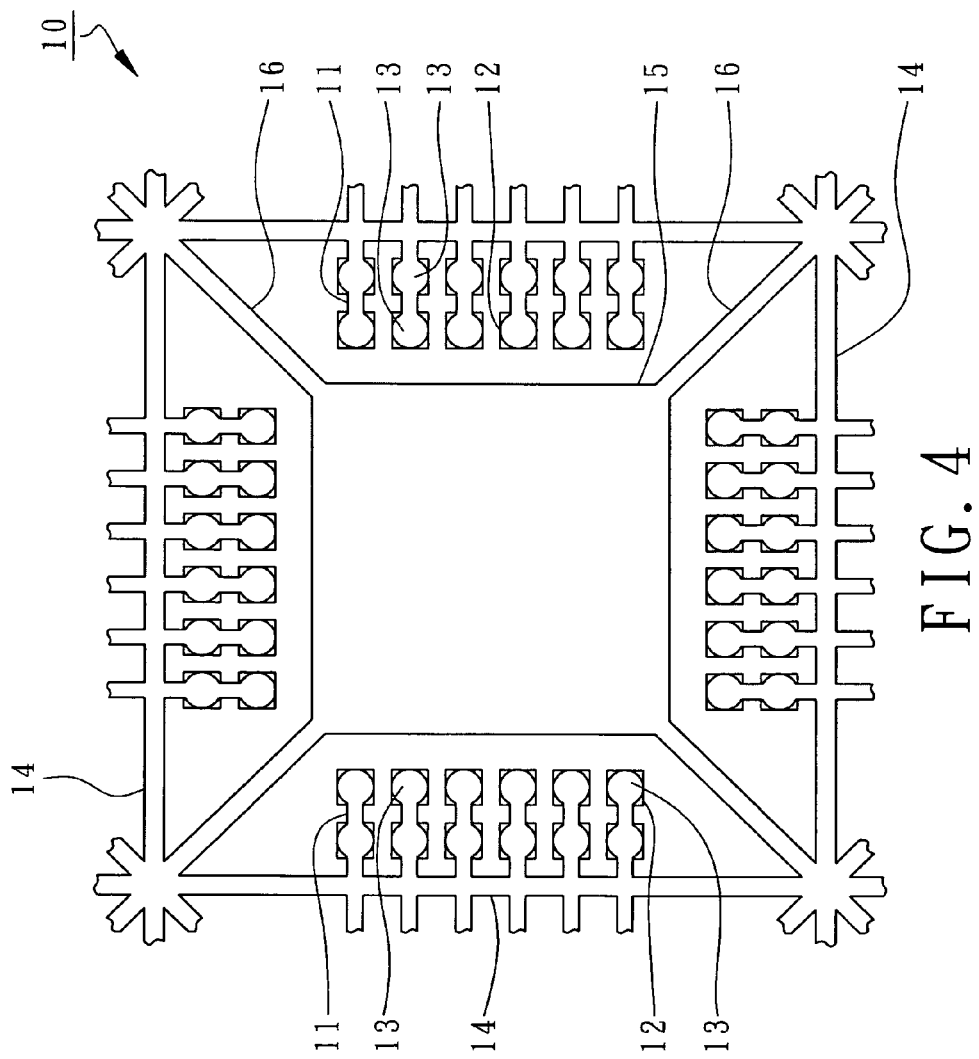
FIG. 4 shows a bottom view of the leadless leadframe implemented in the leadframe-based BGA package according to the first embodiment of the present invention.

According to the first embodiment of the present invention, firstly, in step 1, as shown in FIG. 2A, a leadless leadframe 10 is provided where a plurality of array packaging units are defined to manufacture a plurality of corresponding leadframe-based BGA packages. As shown in FIGS. 3 and 4, in each packaging unit, the leadless leadframe 10 has a plurality of bottom leads 11 and a plurality of top soldering pads 12. The bottom leads 11 are formed in the lower layer of the leadless leadframe 10. The top soldering pads 12 are formed in the upper layer of the leadless leadframe 10 which are connected with the bottom leads 11. The bottom leads 11 are connected to the frame bars 14 locating at the unit edge of the leadless leadframe 10 to fix the top soldering pads 12. Preferably, as shown in FIG. 3, the top soldering pads 12 are disposed in an array and each of the bottom leads 11 is connected to at least two of the top soldering pads 12 to achieve a high density layout of the top soldering pads 12. As shown in FIGS. 2A and 4, the leadless leadframe 10 further has a plurality of sacrificial pads 13 formed in the lower layer. The sacrificial pads 13 are connected to the corresponding bottom leads 11 and are aligned with the top soldering pads 12 to offer a half-etching buffer thickness for the top soldering pads 12. In the present embodiment, as shown in FIG. 4, the sacrificial pads 13 are round, which diameter is greater than the width of the bottom leads 11. And the top soldering pads 12 can be square or any shapes, which width is greater than the ones of the bottom leads 11. The leadless leadframe 10 might have at least a die pad 15 for the attachment of the chip 20 where the die pad 15 is connected to the frame bars 14 through a plurality of tie bars 16. The leadless leadframe 10 can be fabricated by attaching two different etching masks to both sides of a copper foil then followed by etching the copper foil.

Then, step 2 of "die attaching" is performed. As shown in FIG. 2B, at least a chip 20 is attached to the die pad 15 of the leadless leadframe 10 where the chip 20 has a plurality of bonding pads 21 as electrical terminals.

Step 3 of "electrically connecting" can be done after step 2 or simultaneously with step 2. The chip 20 is electrically connected to the leadless leadframe 10 by wire bonding or by flip chip. In the present embodiment, as shown in FIG. 2C, a plurality of bonding wires 30 electrically connect the bonding pads 21 of the chip 20 to the top soldering pads 12 of the leadless leadframe 10.

Then, in step 4 of "encapsulating", as shown in FIG. 2D, an encapsulant 40 is formed on the leadless leadframe 10 to encapsulate the chip 20 and the bonding wires 30 by molding, printing, or dispensing where molding is most practical to let the encapsulant 40 have a neat appearance. During molding processes, a temporary tape can be adapted for being attached to the bottom surface of the leadless leadframe 10, not shown in the figure. In the present embodiment of FIG. 4, the encapsulant 40 encapsulates the chip 20, the bonding wires 30, and the top soldering pads 12. After curing of the encapsulant 40, the tape can be removed. The bottom leads 11, the bottom sacrificial pads 13, and the tie bars 16 are exposed from the bottom surface of the encapsulant 40.

After step 4 of "encapsulating", step 5 of "half-etching" is followed. The bottom layer of the leadless leadframe 10 is then etched by an etching solution such as $CuCl_2$. As shown in FIG. 2E, the bottom leads 11 and the bottom sacrificial pads 13 are removed to make the top soldering pads 12 electrically isolated, exposed and embedded in the encapsulant 40. The space left from etching the bottom sacrificial pads 13 will form a plurality of dents 41 in the bottom surface of the encapsulant 40. Preferably, as shown in FIG. 4, the dimension of the bottom sacrificial pads 13 is smaller than the one of the top soldering pads 12, therefore, the exposed area of the bottom surface of the top soldering pads 12 is then defined by the etched bottom sacrificial pads 13 so that the encapsulant 40 has the functions of anti-soldering and anti-etching without using solder masks to reduce the packaging cost. In the present embodiment, the peripheries of the edge of the bottom surface of the top soldering pads 12 are encapsulated by the encapsulant 40 to enhance the adhesion of the top soldering pads 12 in the encapsulant 40. Moreover, when there are mold flashes which cover or partially cover the bottom surface of the bottom sacrificial pads 13, the half-etching rate will be impacted where residues of the bottom sacrificial pads 13 or the bottom leads 11 will remain on the encapsulant 40 leading to different etching depths of the bottom sacrificial pads 13 or different colors of the remaining bottom leads 11 from the ones of encapsulant 40 which can easily be detected by visual inspection. Since, after step 5 of "half-etching", there is a gap between the mold flashes and the top soldering pads 12, therefore, the mold flashes can easily be removed.

Figure 2F:
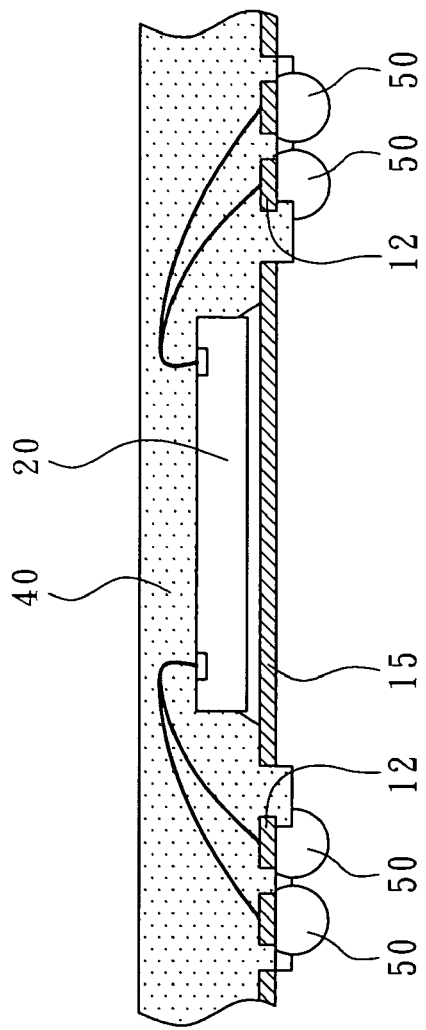
Figure 2G:
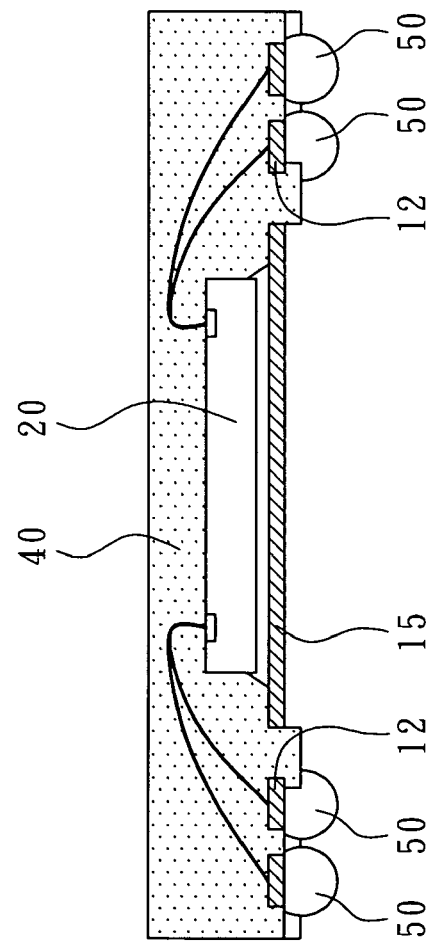

Then, in step 6 of "solder ball placing", as shown in FIG. 2F, a plurality of solder balls 50 are placed on the top soldering pads 12 through the dents 41. There are two ways to place the solder balls. One is that the preformed solder balls 50 are placed on the top soldering pads 12 by flux, then through reflow, the solder balls 50 will be soldered on the exposed surface of the top soldering pads 12. The other is to print solder paste on the exposed surface of the top soldering pads 12, then through reflow, the solder paste will become solder balls 50. During reflow, the solder balls 50 will completely fill the dents 41 (the space formed by the etched bottom sacrificial pads 13) to get a better soldering strength. Finally, in step 7 of "package sawing", as shown in FIG. 2G, the encapsulant 40 is sawed along the peripheries of the packaging units to form a plurality of individual leadframe-based BGA packages.

Before the packaging processes, the bottom leads 11 are temporarily connected to the top soldering pads 12. After step 5 of "half-etching", the bottom leads 11 are removed, but the top soldering pads 12 have been fixed by the encapsulant 40 and are exposed. Therefore, during step 6 of "solder balls placing", the solder balls 50 are soldered on the top soldering pads 12 after reflow without the conventional issues of insufficient height of the solder balls 50 nor bridging between solder balls 50. Moreover, the soldering area of the top soldering pads 12 is defined by the bottom sacrificial pads 13 so that there is no need for solder masks for solder balls placement.

Preferably, as shown in FIGS. 3 and 4, the tie bars 16 are formed in the lower layer of the leadless leadframe 10 so that the tie bars 16 are removed with the bottom leads 11 at the same time. When solder paste is formed under the bottom of the die pad 15, the diffusion of the solder paste along the tie bars 16 can be avoided.

Figure 5:
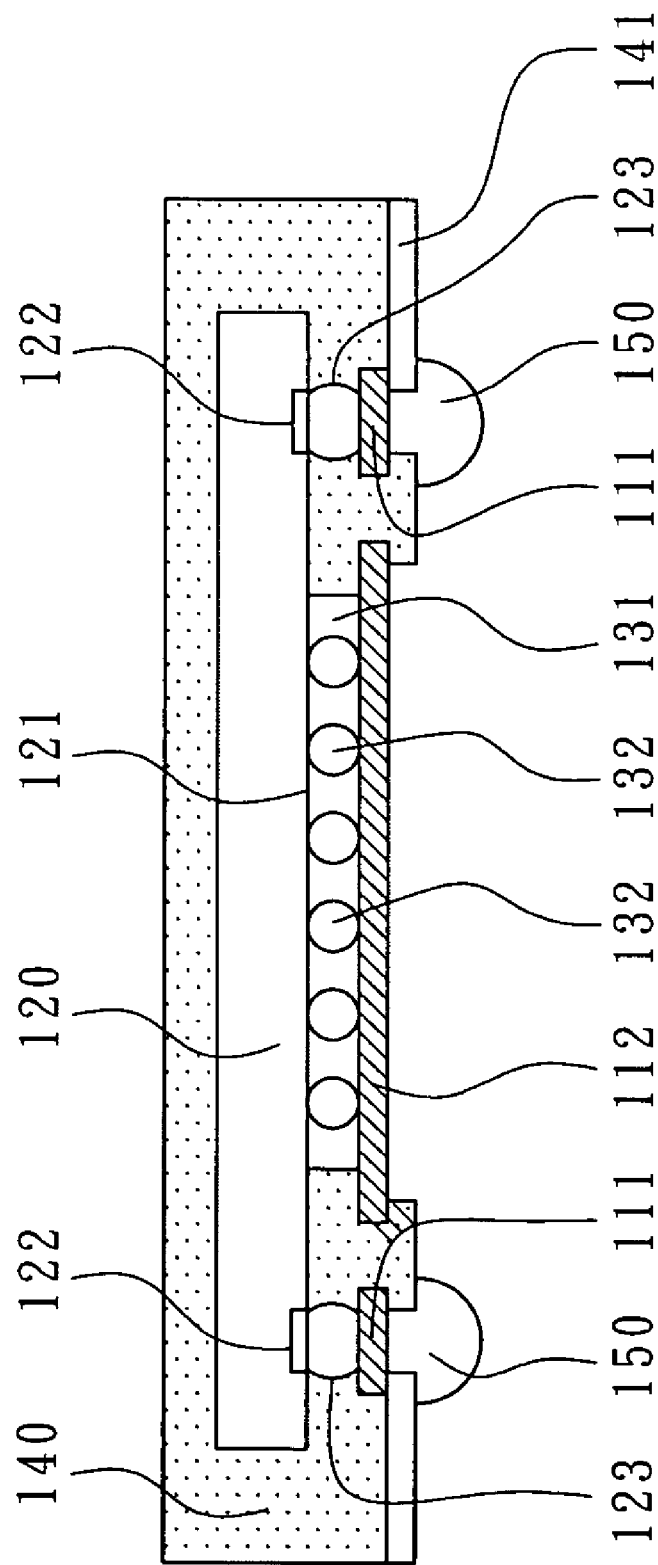
FIG. 5 shows a cross sectional view of a leadframe-based BGA package according to the second embodiment of the present invention.

Another leadframe-based BGA package is revealed in FIG. 5 according to the second embodiment of the present invention. The package has a flip-chip configuration, mainly includes a leadless leadframe with top soldering pads 111, a chip 120, an encapsulant 140, and a plurality of solder balls 150. The mainly manufacturing steps are described as shown in FIG. 1. In step 1 of "providing a leadless leadframe", the leadless leadframe has top soldering pads 111 which are connected by the bottom leads, not shown in the figure. In the present embodiment, the leadless leadframe further has a die pad 112. Then, in the step 2 of "die-attaching", a chip 120 is flip-chip attached to the leadless leadframe where the active surface 121 of the chip 120 has a plurality of bonding pads 122. By using a plurality of bumps 123 to electrically connect the bonding pads 122 to the top soldering pads 111 to complete step 3 of "electrically connecting" at the same time. Preferably, during die attaching, a die-attaching film 131 with a plurality of equal-diameter ball spacers 132 is attached to the die pad 112 and adheres the active surface 121 of the chip 120 to enhance the adhesion of the chip 120 and to define the gap between the chip 120 and the leadless leadframe to ensure the same extent of collapse of the bumps 123. However, if the joint of bumps 123 and the leadless leadframe is done by eutectic bonding or anisotropic adhesive, then the die-attaching film 131 and the ball spacers 132 are not necessary. Then, in step 4 of "encapsulating", the encapsulant 140 is formed on the leadless leadframe. Then in step 5 of "half-etching", the bottom leads are removed to expose the top soldering pads 111, and the top soldering pads are electrically isolated and embedded in the encapsulant 140. Then, in step 6 of "solder ball placing", a plurality of solder balls 150 are soldered at the top soldering pads 111 since the soldering area for the solder balls 150 can be defined without solder masks. Moreover, mold flashes can easily be detected and removed, and the soldering strength of the solder balls can be enhanced. Moreover, the overall cost of the package can be reduced.

The above description of embodiments of this invention is intended to be illustrative and not limiting. Other embodiments of this invention will be obvious to those skilled in the art in view of the above disclosure.

What is claimed is:

1. A leadless leadframe implemented in a leadframe-based BGA package, comprising a plurality of bottom leads and a plurality of top soldering pads with a two-layer structure, wherein the top soldering pads are formed in the upper layer, the bottom leads are formed in the lower layer and are connected to the top soldering pads, and the leadless leadframe further has a plurality of bottom sacrificial pads formed in the lower layer, connected to and aligned with the top soldering pads, wherein the bottom leads and the bottom sacrificial pads are made of an etchable metal.

2. The leadless leadframe of claim 1, wherein the top soldering pads are disposed in an array and each of the bottom leads is connected to at least two of the top soldering pads.

3. The leadless leadframe of claim 1, wherein the sacrificial pads are round and are smaller than the top soldering pads.

4. The leadless leadframe of claim 3, wherein the top soldering pads are square.

5. The leadless leadframe of claim 1, further comprising at least a die pad.

6. The leadless leadframe of claim 5, further comprising a plurality of tie bars connected to the die pad.

7. The leadless leadframe of claim 6, wherein the tie bars are only formed in the lower layer, the tie bars being made of the etchable metal.

* * * * *